United States Patent [19]

Sashital et al.

[11] Patent Number: 4,540,461
[45] Date of Patent: Sep. 10, 1985

[54] SILVER THIOGALLATE SINGLE CRYSTAL LAYERS EPITAXIALLY GROWN FROM POTASSIUM CHLORIDE-SILVER THIOGALLATE SOLUTION

[75] Inventors: Sanat K. Sashital, Thousand Oaks; Robert L. Joyce, Newbury Park; Anthony L. Gentile, Thousand Oaks, all of Calif.

[73] Assignee: Hughes Aircraft Company, El Segundo, Calif.

[21] Appl. No.: 605,359

[22] Filed: Apr. 30, 1984

[51] Int. Cl.³ ............................................. C30B 19/02
[52] U.S. Cl. .......................... 156/624; 156/DIG. 101
[58] Field of Search ............... 148/171; 156/621, 622, 156/624, DIG. 70, DIG. 72, DIG. 92, DIG. 101; 423/511; 252/364

[56] References Cited

U.S. PATENT DOCUMENTS 3,902,860 9/1975 Akai et al. ........................... 156/609
4,077,817 3/1978 Bellavance ...................... 156/624 X
4,197,008 4/1980 Pinnow et al. ................. 350/393 X
4,376,659 3/1983 Castro ................... 156/DIG. 72 X

OTHER PUBLICATIONS

Kamath et al., Large-Area High-Efficiency (Al-Ga)As-GaAs Solar Cells.
IEEE Transactions on Electron Devices, vol. ED-24, No. 4, Apr. 1977, pp. 473-475.
Chedzey et al., A Study of the Melt Growth of Single-Crystal Thiogallates, J. Phys. D: Appl. Phys., 1971, vol. 4, pp. 1320-1324.

Primary Examiner—Hiram H. Bernstein
Assistant Examiner—Michael S. Gzybowski
Attorney, Agent, or Firm—John A. Sarjeant; A. W. Karambelas

[57] ABSTRACT

A method of making a thin, high purity single crystal layer of silver thiogallate. According to the preferred embodiment of this method, a seed crystal substrate of silver thiogallate is dipped into a molten solution of silver thiogallate dissolved in potassium chloride. Upon slowly cooling the solution, the thin layer of single crystal silver thiogallate forms on the substrate. Upon removal, very little of the potassium chloride adheres to the surface, and what does adhere to the surface can be easily removed by washing the surface with hot water.

9 Claims, 1 Drawing Figure

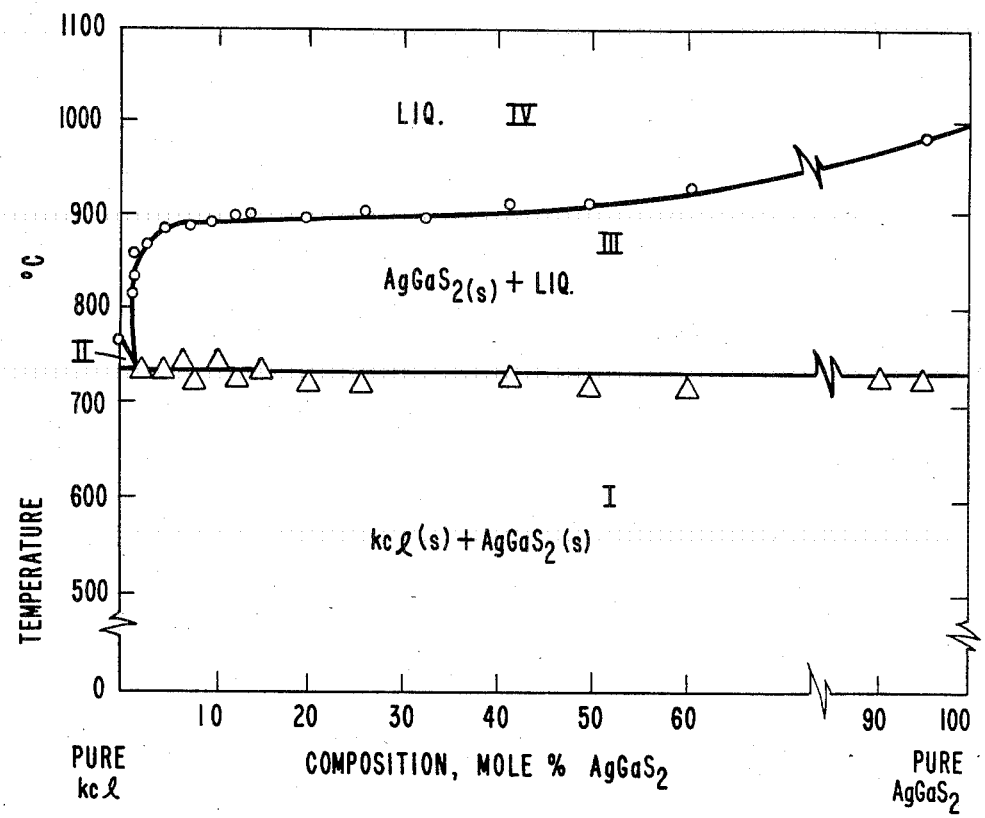

SILVER THIOGALLATE SINGLE CRYSTAL LAYERS EPITAXIALLY GROWN FROM POTASSIUM CHLORIDE-SILVER THIOGALLATE SOLUTION

RIGHTS OF THE UNITED STATES GOVERNMENT

The Government has rights in this invention pursuant to contract No. F04701-82-C-0029, awarded by the Department of the Air Force.

BACKGROUND OF THE INVENTION

1. Field of the Invention

This invention relates to a method of synthesizing a thin, single crystal layer of silver thiogallate ($AgGaS_2$) epitaxially grown from a molten solution of potassium chloride (KCl) and silver thiogallate.

2. Description of the Prior Art

In U.S. Patent Application Ser. No. 605,363, S. R. Sashital entitled, "A Method of Synthesizing a Highly Pure, Thin, Single Crystal of Silver Thiogallate", filed on the same date as this application, there is described a method for making a thin, single crystal of silver thiogallate. According to this method, the crystal is epitaxially grown on a substrate which is dipped into a molten solution of silver thiogallate dissolved in a solvent comprising either antimony sulfide or lead sulfide. The substate on which the crystal is epitaxially grown is a seed crystal which has a proper lattice parameter relationship with silver thiogallate. This substrate is dipped into the molten solution previously described at a temperature below the liquidus temperature for the molten solution. After the substrate is dipped into the molten solution, the solution is slowly cooled so that silver thiogallate will crystallize from the solution. The substrate or seed crystal serves as a nucleus for crystal growth. Crystallization proceeds in the form of an epitaxial layer on the surface of the substrate. The cooling rate directly affects the crystal growth rate and the optimum growth rate depends on the solvent system involved.

Although the silver thiogallate single crystal layers may be advantageously formed from either an antimony sulfide or a lead sulfide solution of the silver thiogallate as described, the method has some undesirable aspects associated with it. First, because the solvent has a very high viscosity, then upon removal of the silver thiogallate crystal/substrate from the molten solution, a certain amount of the solvent, either the antimony sulfide or lead sulfide as a case may be, adheres to the surface of the crystal. These sulfides solidify on cooling. Because of the differences in thermal coefficients of expansion between the different materials, internal stresses are generated. Such stresses may lead to cracking of the substrate, especially if the substrate has a large number of defects. Thus, it would be highly advantageous if no or very little of the solvent adhered to the surface of the crystal upon removal from the solution. Second, the high viscosity of the antimony and lead sulfides tends to suppress the growth rate of the epitaxial layer being formed. Consequently, a lower viscosity solvent would produce the same thickness of crystal material in a shorter period of time. Third, the viscous solvent is a factor in the production of facets in the surface of the crystal being formed. These facets appear as corrugations in the crystal's surface.

SUMMARY OF THE INVENTION

In accordance with the invention, potassium chloride may be used in place of either the anitmony sulfide or lead sulfide to epitaxially grow a thin, single crystal layer of silver thiogallate from a molten solution. This discovery thus provides a process for growing a single crystal of silver thiogallate without the limitations discussed above. Briefly, the method of this invention comprises, (a) preparing a liquid solution of silver thiogallate in potassium chloride, (b) placing in this solution a seed crystal which has a proper lattice parameter relationship with silver thiogallate, and (c) slowly cooling the solution to form on the seed crystal a layer of the single crystal of silver thiogallate.

The seed crystal is preferably silver thiogallate and it is prepared in accordance with the procedure described in the above-identified Sashital patent application and as described below. The details of the steps of the crystal growth method of this invention are similar to those set forth in the Sashital patent application, except that conditions are adjusted as called for by the temperature-composition phase equilibrium diagram for the $AgG_2S_2$-KCl system. Specifically, the composition of the molten solution may vary widely, from about 2 mole percent to about 98 mole percent $AgGaS_2$ in KCl. This is a much wider range than is available using either the antimony sulfide or lead sulfide solvents described in the above-identified application. The temperature of the solution during crystal formation ranges between about 735° C. and about 995° C., roughly the same temperature ranges using antimony sulfide or lead sulfide. But because of the lower vapor pressure of the KCl, the problems associated with vaporization of the solvent are reduced. Moreover, because of the lower viscosity of the KCl, it does not adhere as readily to the surface of the crystal/substrate as the antimony and lead sulfide. During crystal formation, the cooling rate of the solution ranges between about 0.02° C. per minute and 0.20° C. per minute.

The use of potassium chloride as the solvent for the silver thiogallate provides several advantages. These are:

1. The silver thiogallate material is highly soluble in the molten potassium chloride.

2. The silver thiogallate crystalline phase which is forming on the substrate is highly stable and there are essentially no additional spurious phases.

3. The potassium chloride forms a single binary eutectic with a broad solute-solubility range of compositions compared to the antimony and lead sulfide systems.

4. The constituents of the potassium chloride are not incorporated in the silver thiogallate single crystal layers to any measurable degree.

5. The potassium chloride has a low viscosity, as compared to the antimony sulfide and the lead sulfide.

6. The potassium chloride has a low vapor pressure at the high temperatures of 735° C. to 995° C. employed.

7. The potassium chloride is easily removed from the surface of the silver thiogallate crystal upon removal from the molten solution by washing the surface with hot water.

8. The potassium chloride is non-toxic as opposed to the toxic antimony sulfide and lead sulfide.

BRIEF DESCRIPTION OF THE DRAWINGS

The features of the present invention can best be understood, together with the advantages discussed above and other advantages, by reference to the following description taken in connection with the drawing, in which FIG. 1 is a temperature-composition phase equilibrium diagram for the silver thiogallate-potassium chloride system.

DETAILED DESCRIPTION OF THE INVENTION

A thin single crystal layer of silver thiogallate is grown from a solute-solvent system wherein the solvent is molten potassium chloride. The temperature-composition phase equilibrium diagram of this system, as depicted in FIG. 1, shows that the eutectic mixture is at 97.5% molten potassium chloride and the eutectic melting point is 735° C. As shown in FIG. 1, the AgGaS$_2$-KCl system has four regions. I: below 735° C. AgGaS$_2$ (solid)+KCl (solid); II: liquid+KCl (solid) for KCl>98 mole %; III: liquid+AgGaS$_2$ (solid) for AgGaS$_2$>2 mole %; and IV: liquid for temperatures above the liquidus. As illustrated by FIG. 1, the useful composition range over which crystal growth occurs is between 2–98 mole % AgGaS$_2$. Optimum growth conditions for the typical compositions are:

| 1. | AgGaS$_2$ 7.5 mole %: | |
|---|---|---|
| | Dipping temperature: | 782° C. |
| | Substrate removal: | 773° C. |
| | Cooling rate: | 0.056° C./min. |
| 2. | AgGaS$_2$ 10 mole %: | |
| | Dipping temperature: | 800° C. |
| | Substrate removal: | 785° C. |
| | Cooling rate: | 0.06° C./min. |
| 3. | AgGaS$_2$ 23.0 mole %: | |
| | Dipping temperature: | 810° C. |
| | Substrate removal: | 790° C. |
| | Cooling rate: | 0.095° C./min. |
| 4. | AgGaS$_2$ 37.5 mole %: | |
| | Dipping temperature: | 840° C. |
| | Substrate removal: | 810° C. |
| | Cooling rate: | 0.1° C./min. |

A substrate having the proper lattice parameter relationship with silver thiogallate is utilized as the seed crystal upon which the epitaxially-grown layer of single crystal is crystallized. Appropriate substrate materials are those with lattice parameters which sufficiently match those of silver thiogallate, such as a group of compounds comprising a I-III-IV$_2$ chemical composition and having a substantially chalcopyrite structure. Examples of such compounds includes AgGaS$_2$, AgAlS$_2$, AgAlSe$_2$, and CuGaS$_2$.

The seed crystal is immersed in the molten solution at the appropriate dipping temperature as shown in the composition-condition examples given above. Subsequent cooling of the molten solution is commenced at a rate as given in the same examples. During cooling, the layer of single crystal silver thiogallate is formed on the substrate as the silver thiogallate crystallizes from the molten solution. During formation of the single crystal layer, the substrate may be slowly rotated, for example, at 4 to 10 rpm. Growth rates for the single crystal layer range from about 0.05 to about 0.20 micrometers per minute. The thickness of the single crystal layer obtained ranges from about 15 to about 30 micrometers over the range of experimental conditions given above.

The following is a detailed example for growing a single crystal of silver thiogallate crystals on a seed crystal of silver thiogallate from the solute-solvent depicted in FIG. 1.

EXAMPLE I

Two hundred grams of a 7.5 mole % AgGaS$_2$ and 92.5 mole % KCl mixture was heated to 890° C. in a quartz crucible, under an argon atmosphere of 1 psi. The molten solution was then maintained at this temperature for 16 hours to allow the ingredients to equilibrate. The solution was then slowly cooled at a rate of 0.5° C./minute to 782° C. At this temperature, a seed crystal of AgGaS$_2$ was immersed in the molten solution. The seed crystal of silver thiogallate was prepared by reacting silver gallium alloys with sulfur vapors. Prior to reaction, the molten silver gallium alloys were equilibrated at 745° C. in flowing hydrogen for at least eight hours to provide for reduction of any surface oxides. The reacted silver gallium sulfide polycrystalline compound was then four-pass zone-refined for removal of any small quantities of second phase (Ag$_9$GaS$_6$ or Ag$_2$Ga$_{10}$S$_{31}$) precipitates.

Subsequently, cooling of the AgGaS$_2$/KCl solution was again commenced at a rate of 0.056° C. per minute until the solution temperature reached 773° C. Simultaneously, the seed crystal was rotated at a rate of 5 rpm. On reaching 773° C., the seed crystal with a layer of single crystal silver thiogallate (crystal/substrate) formed on it was withdrawn. The crystal/substrate was allowed to cool slowly and then washed in hot water (80° C.) for five minutes. The thickness of the silver thiogallate layer was 16 micrometers.

The above description presents the best mode contemplated for carrying out the present invention. This invention is, however, susceptible to modifications and alternate constructions from the embodiment shown in the drawing and described above. Consequently, it is not the intention to limit this invention to the particular embodiment disclosed. On the contrary, the intention is to cover all modifications and alternate constructions falling within the spirit and scope of the invention as expressed in the appended claims.

What is claimed is:

1. A method of making a single crystal of silver thiogallate comprising the steps of:
    (a) preparing a liquid solution of silver thiogallate in potassium chloride;
    (b) placing in the solution a seed crystal which has a proper lattice parameter relationship with silver thiogallate; and
    (c) slowly cooling the solution to form on the seed crystal a thin layer of a single crystal of silver thiogallate.

2. The method of claim 1 wherein the solution is cooled at a rate ranging between about 0.02° C. per minute and about 0.20° C. per minute.

3. The method of claim 1 wherein during formation of the crystal the solution is at a temperature between about 735° C. and about 995° C.

4. The method of claim 3 wherein the amount of silver thiogallate in the solution ranges between about 2 and about 98 mole %.

5. The method of claim 1 wherein the seed crystal is a compound selected from a group of compounds comprising a I-III-VI$_2$ chemical composition and having a substantially chalcopyrite structure.

6. The method of claim 5 wherein the seed crystal is silver thiogallate.

7. A method of making a single crystal of silver thiogallate comprising the steps of:
   (a) preparing a liquid solution of silver thiogallate in potassium chloride, with the concentration of the silver thiogallate being in the range between about 2 and 98 mole %, and the solution temperature being between about 735° and about 995° C.;
   (b) placing in the solution a seed crystal of silver thiogallate; and
   (c) slowly cooling the solution at a rate ranging between about 0.02° C. per minute and about 0.20° C. per minute to form on the seed crystal a thin layer of a single crystal of silver thiogallate.

8. The method of claim 7 wherein during cooling the seed crystal is rotated.

9. The method of claim 7 wherein following cooling, the seed crystal with the single crystal of silver thiogallate formed thereon is removed from the molten solution and washed with water to remove any potassium chloride adhering to its surface.

* * * * *